(12) United States Patent
Trimberger et al.

(10) Patent No.: US 8,179,159 B1
(45) Date of Patent: May 15, 2012

(54) CONFIGURATION INTERFACE TO STACKED FPGA

(75) Inventors: Stephen M. Trimberger, San Jose, CA (US); Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/116,276

(22) Filed: May 26, 2011

Related U.S. Application Data

(62) Division of application No. 12/128,459, filed on May 28, 2008, now Pat. No. 7,973,555.

(51) Int. Cl.
*H03K 19/173* (2006.01)
*G06F 7/38* (2006.01)

(52) U.S. Cl. ............... 326/38; 326/39; 326/41

(58) Field of Classification Search .............. None
See application file for complete search history.

(56) References Cited

U.S. PATENT DOCUMENTS

| | | | |
|---|---|---|---|
| 5,170,468 A * | 12/1992 | Shah et al. ............... 345/537 |
| 5,561,622 A | 10/1996 | Bertin et al. | |
| 5,781,031 A | 7/1998 | Bertin et al. | |
| 5,793,115 A | 8/1998 | Zavracky et al. | |
| 6,009,483 A * | 12/1999 | Fueki ............... 710/36 |
| 6,204,687 B1 | 3/2001 | Schultz et al. | |
| 6,337,579 B1 | 1/2002 | Mochida | |
| 6,781,226 B2 | 8/2004 | Huppenthal et al. | |
| 6,875,921 B1 | 4/2005 | Conn | |
| 6,917,219 B2 | 7/2005 | New | |
| 7,068,072 B2 | 6/2006 | New et al. | |
| 7,095,253 B1 | 8/2006 | Young | |
| 7,098,542 B1 | 8/2006 | Hoang et al. | |
| 7,193,239 B2 * | 3/2007 | Leedy ............... 257/74 |
| 7,233,061 B1 | 6/2007 | Conn | |
| 7,314,174 B1 | 1/2008 | Vadi et al. | |
| 7,518,398 B1 | 4/2009 | Rahman et al. | |
| 7,605,458 B1 | 10/2009 | Rahman et al. | |
| 2004/0262635 A1 | 12/2004 | Lee | |
| 2007/0152708 A1 | 7/2007 | Madurawe et al. | |
| 2008/0042140 A1 | 2/2008 | Alam et al. | |
| 2011/0012633 A1 | 1/2011 | Rahman et al. | |

OTHER PUBLICATIONS

U.S. Appl. No. 12/128,459, filed May 28, 2008, Trimberger et al.

(Continued)

*Primary Examiner* — Shawki S Ismail
*Assistant Examiner* — Crystal L Hammond
(74) *Attorney, Agent, or Firm* — Scott Hewett; LeRoy D. Maunu

(57) ABSTRACT

A method of configuring a stacked integrated circuit ("IC") having a first IC die with configurable logic and a second IC die electrically coupled to the first IC die through an array of inter-chip contacts includes: providing a frame having frame data and a frame address in a frame header to the first IC die; storing the frame data in a frame data register of the first IC die; processing the frame header to determine whether a frame destination is in the first IC die or the second IC die; in response to determining that the frame destination is in the second IC die, providing the frame address to the second IC die through an inter-chip frame address bus including a first plurality of the array of inter-chip contacts; and writing the frame data from the frame data register of the first IC die to the frame destination through an inter-chip frame data bus including a second plurality of the array of inter-chip contacts.

15 Claims, 7 Drawing Sheets

OTHER PUBLICATIONS

U.S. Appl. No. 11/973,245, filed Oct. 4, 2007, Rahman et al.

Baliga, John et al., *Through-Silicon Technology, Applications Growing*, Mar. 1, 2005, pp. 1-3, available from Semiconductor International, 2000 Clearwater Drive, Oak Brook, IL 60523 or www.semiconductor.net.

Garrou, Phillip, *Future ICs Go Vertical*, Feb. 1, 2005, pp. 1-10, available from Semiconductor International, 2000 Clearwater Drive, Oak Brook, IL 60523 or www.semiconductor.net.

Guarini, K. W. et al., "Electrical Integrity of State-of-the-Art 0.13 μm SOI CMOS Devices and Circuits Transferred for Three-Dimensional (3D) Integrated Circuit (IC) Fabrication " *Proc. of the 2002 IEEE International Electron Devices Meeting (IEDM'02)* Dec. 8-11, 2002, pp. 943-945, IEEE, Piscataway, New Jersey, USA.

Ieong, Meikei et al., Three Dimensional CMOS Devices and Integrated Circuits, *Proc. of the 2003 IEEE Custom Integrated Circuits Conference*, Sep. 21-24, 2003, pp. 207-213, Piscataway, New Jersey, USA.

Rahman, A. et al., "Die Stacking Technology for Terabit Chip-to-Chip Communications " *Proc. of the 2006 IEEE Custom Integrated Circuits Conference*, Sep. 10-13, 2006, pp. 587-590, Piscataway, New Jersey, USA.

* cited by examiner

CONFIGURATION INTERFACE TO STACKED FPGA

FIELD OF THE INVENTION

One or more aspects of the present invention relate generally to semiconductor devices and, more particularly, to a configurable integrated circuit having second IC die stacked on and interconnected to a field programmable gate array die.

BACKGROUND

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In some cases, one of the dies is an FPGA and the second IC die(s) is configurable or affects the configuration of the FPGA. It is desirable to provide techniques for configuring stacked ICs.

SUMMARY

A semiconductor device includes a field-programmable gate array ("FPGA") die having a frame address bus, a frame data bus, and a second integrated circuit ("IC") die attached to the FPGA die. An inter-chip frame address bus couples at least low order frame address bits of a frame address of a frame between the FPGA die and the second IC die. The inter-chip frame address bus includes a first plurality of contacts formed between the FPGA die and the second IC die. An inter-chip frame data bus couples frame data of the frame between the FPGA die and the second IC die. The inter-chip frame data bus includes a second plurality of contacts formed between the FPGA die and the second IC die.

Another embodiment provides a method of configuring a stacked integrated circuit ("IC") having a first integrated circuit die with configurable logic and a second integrated circuit die electrically coupled to the first integrated circuit die through an array of inter-chip contacts. The method includes: providing a frame having frame data and a frame address in a frame header to the first integrated circuit die; storing the frame data in a frame data register of the first integrated circuit die; processing the frame header to determine whether a frame destination is in the first integrated circuit die or is in the second integrated circuit die; in response to determining that the frame destination is in the second integrated circuit die, providing the frame address to the second integrated circuit die through an inter-chip frame address bus including a first plurality of the array of inter-chip contacts; and writing the frame data from the frame data register of the first integrated circuit die to the frame destination through an inter-chip frame data bus including a second plurality of the array of inter-chip contacts.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

It is noted that embodiments of the present invention may be implemented in many types of integrated circuits (I/C). A Field-Programmable Gate Array (FPGA) is one type of integrated circuit, comprising programmable logic, that is particularly well adapted to illustrating concepts found in some embodiments. While other embodiments can be implemented in other integrated circuits, especially those having programmable logic at least in part, field-programmable gate arrays are used in this description for the purpose of illustration. Such use is not intended to limit the scope of application of these embodiments.

Figure 1:
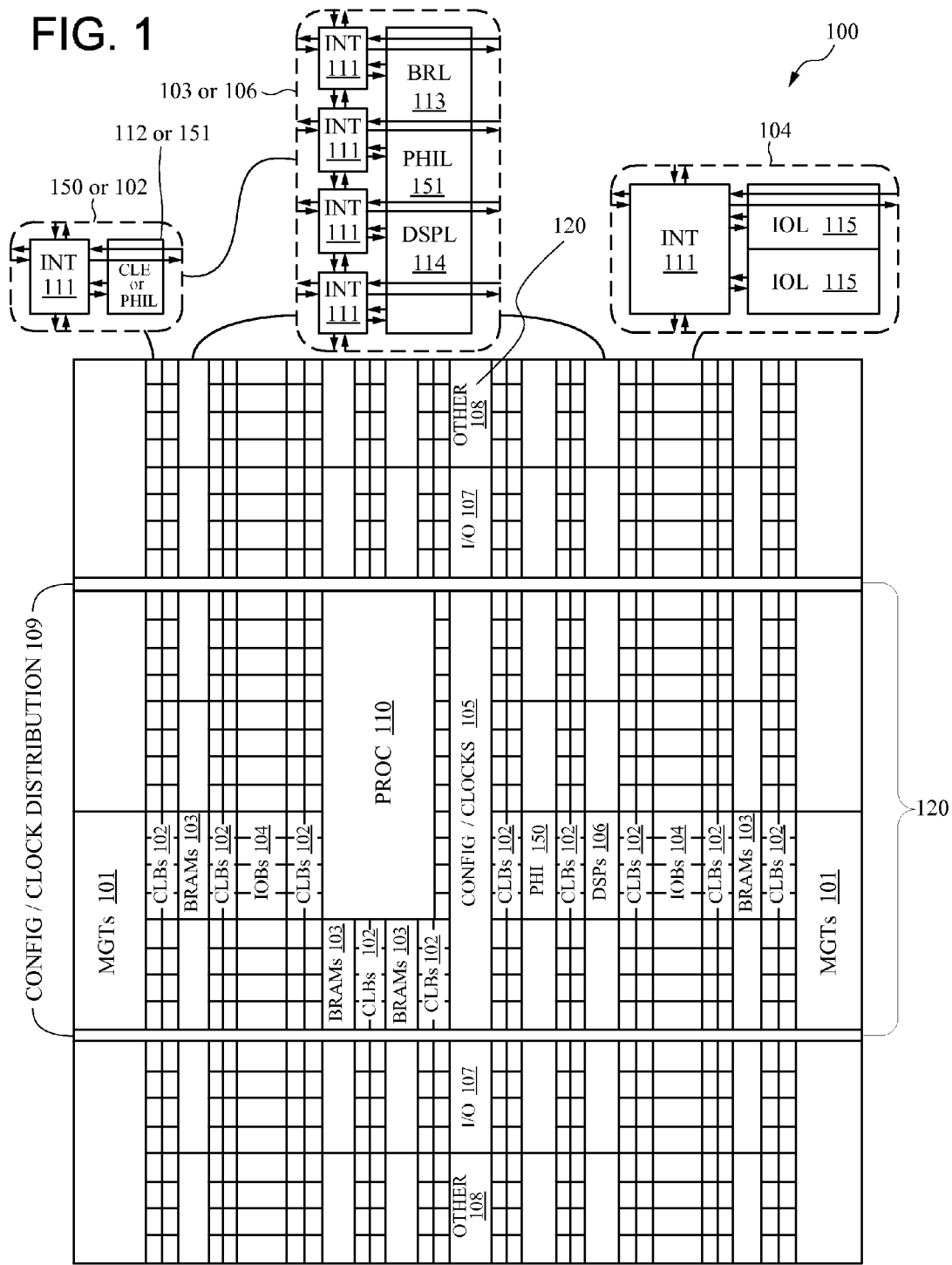
FIG. 1 is a block diagram depicting an exemplary embodiment of an FPGA in accordance with one or more aspects of the invention.

FIG. 1 is a block diagram depicting an exemplary embodiment of an FPGA 100 in accordance with one or more aspects of the invention. The FPGA 100 includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CON- FIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110). The FPGA 100 also includes one or more programmable heterogeneous integration (PHI) tiles 150. In some embodiments, the FPGA 100 includes a plurality of PHI tiles 150 arranged in a column. In some embodiments, the FPGA 100 includes a plurality of columns of PHI tiles 150. The PHI tiles 150 facilitate interconnection to one or more other ICs stacked on the backside of the die of the FPGA 100.

A PHI tile typically includes one or more programmable interconnect elements, a configurable logic element, interface circuits, selection logic, and a plurality of TDVs. The PHI tile also includes an interface to the routing fabric of the FPGA, and another interface ("PHI interface") to the second IC die (see, e.g., FIG. 2, ref. num. 204). Although only a single column of PHI tiles 150 is shown, it is to be understood that the FPGA architecture 100 may generally include one or more columns of PHI tiles 150. The PHI tile 150 generally includes circuitry and TDVs for providing an interface between the FPGA and one or more additional ICs mounted to the backside of the FPGA.

Each of the programmable interconnect elements 111 includes programmable multiplexing structures that couple the PHI tile 150 to the routing conductor segments of the routing fabric interface. A configurable logic element ("CLE") 112 includes one or more slices of logic having lookup tables (LUTs), multiplexers, flip-flops, and the like, as described above with respect to the CLBs.

Selection logic of the PHI tile 150 is configured to selectively change the function of the PHI tile 150 between a programmable logic tile (e.g., a CLB) and an interface tile. For example, the selection logic may be configured such that signals received from the FPGA routing fabric are coupled to the CLE 112, and signals produced by the CLE 112 are coupled to the FPGA routing fabric. In other words, the selection logic causes the PHI tile 150 to operate similar to a CLB tile (e.g., CLB 102). Alternatively, the selection logic may be configured such that signals received from the FPGA routing fabric are coupled to the second IC die (see FIG. 2, ref. num. 204) through interface circuits and TDVs, and signals produced by the second IC die are coupled to the FPGA routing fabric through the interface circuits and the TDVs. In other words, the selection logic causes the PHI tile 150 to operate as an interface tile between the FPGA routing fabric and the second IC die. The function of the PHI tile 150 as implemented by the selection logic may be controlled by the configuration memory cells of the FPGA (not shown) or by a control signal either external to or internal to the PHI tile 150. Additional details regarding stacked FPGAs, including PHI tile operation, is found in commonly owned U.S. Pat. No. 7,518,398, entitled INTEGRATED CIRCUIT WITH THROUGH-DIE VIA INTERFACE FOR DIE STACKING, issued Apr. 14, 2009, the disclosure of which is hereby incorporated in its entirety for all purposes.

In some embodiments, the IC(s) stacked on the backside of the FPGA die are configurable, such as a second FPGA or a CLD. In other embodiments, the IC(s) are not configurable, but provide additional functionality to the stacked IC, such as providing more RAM, either volatile or non-volatile, ROM, or more logic, such as a co-processor chip or a communications interface. The stacked IC is configured using FPGA configuration frames and FPGA frame addresses that direct the configuration information to the proper location in the proper chip in the stacked IC.

The configuration information is supplied to the stacked chip through vertical connections from the FPGA (e.g., through an array of hundreds, thousands or tens-of-thousands of micro-bumps on the top of the FPGA chip). In a particular embodiment, there are sufficient micro-bumps or other vertical connections (i.e., from the top of the lower die to the bottom of the upper die) to directly connect the entire frame data bus. In a more particular embodiment, the frame data is 1312 bits wide, and at least 1312 microbumps are used to interconnect the stacked dice. Alternatively, the configuration interconnection between the dice uses fewer bumps than the bus width of the FPGA data frame, and data from a data frame is segmented in one device and buffered in the other.

Directly connecting the frame bus between the upper and lower dies allows the upper (stacked) die to be addressed just like it was part of the FPGA. The second IC die can interface directly to the FPGA configuration logic and look like other configuration memory or a configuration source. This way, a stacked non-volatile memory, for example, can be loaded through the FPGA's configuration interface, and it can also configure the FPGA.

A second IC die containing FPGA configuration data can be used to configure the FPGA by having the FPGA read a frame associated with the second IC die (memory), holding the data in the frame data register (FDR), setting the destination address in the frame address register (FAR) and then executing a write to the new frame location. If the configuration logic is modified and if the second IC die drivers are strong enough or if the incoming signals are sufficiently buffered on the FPGA, this can be done as a direct memory access (DMA), writing directly from the second IC die to an on-FPGA frame.

In some FPGAs, each programmable tile includes a programmable interconnect element (INT 111) having standardized connections via routing conductor segments to and from a corresponding interconnect element in each adjacent tile. Therefore, the programmable interconnect elements and routing conductor segments taken together implement the programmable interconnect structure for the illustrated FPGA. The programmable interconnect element (INT 111) also includes the connections to and from the programmable logic element within the same tile, as shown by the examples included at the top of FIG. 1. The programmable interconnect element (INT 111) may also include connections via routing conductor segments to and from a corresponding interconnect element that span multiple columns of logic. That is, routing conductor segments may span a plurality of tiles (e.g., a "hex" line spans six tiles).

For example, a CLB 102 can include a configurable logic element (CLE 112) that can be programmed to implement user logic plus a single programmable interconnect element (INT 111). The CLE 112 includes one or more slices of logic (not shown). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements (e.g., four are shown). A PHI tile 150 includes a PHI logic element (PHIL 151) in addition to an appropriate number of programmable interconnect elements (e.g., four are shown). An 10B 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (120 in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA, more than one adjacent column of CLBs is typically included wherever the CLBs appear, to facilitate the efficient implementation of user logic. Examples of FPGAs that may be used with embodiments of the invention include the VIRTEX 5 FPGAs available from XILINX, INC., of San Jose, Calif.

Figure 2:
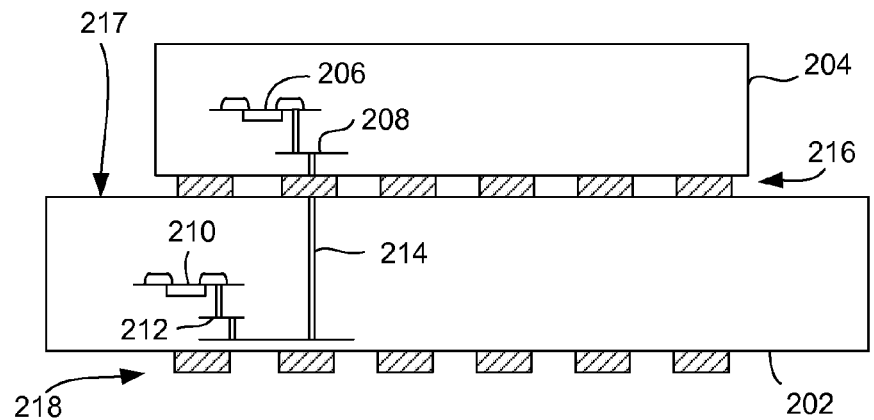
FIG. 2 is a cross-sectional view showing an exemplary embodiment of a semiconductor device in accordance with one or more aspects of the invention.

FIG. 2 is a cross-sectional view showing an exemplary embodiment of a semiconductor device 200 in accordance with one or more aspects of the invention. The semiconductor device 200 includes an FPGA die 202 and a second IC die 204. The semiconductor device including the FPGA die 202 and the second IC die 204 is configured according to an embodiment. The second IC die 204 may comprise any type of digital, analog, or mixed-signal IC. The second IC die 204 is vertically stacked with the FPGA die 202. Each of the die 202, 204 is configured for face-down mounting in flip-chip fashion; however, this is not required for all embodiments. As discussed above, the term "face side" denotes the side of a die that receives the bulk of semiconductor processing such that circuitry is fabricated on that face side of the die. The side of a die opposite the face side is referred to as the backside of the die. Thus, the face side of the second IC die 204 is mounted to the backside of the FPGA die 202.

In particular, the second IC die 204 includes circuitry formed on a semiconductor substrate. A portion of the circuitry is symbolically shown by a transistor 206. The second IC die 204 also includes conductive interconnect formed over the circuitry. A portion 208 of the conductive interconnect is symbolically shown by signal vias coupled to a metal layer.

The FPGA die 202 includes circuitry formed on a semiconductor substrate and conductive interconnects formed over the circuitry, typically in a number of interconnected patterned metal layers. The FPGA die 202 also includes an array of bump contacts 218 formed on the face side for flip-chip mounting to a carrier. A portion of the circuitry is symbolically shown by a transistor 210. A portion 212 of the conductive interconnect is symbolically shown by signal vias coupled to metal layers. The FPGA die 202 also includes a through-die via (TDV) 214 and an array of contacts 216, which in a particular embodiment are an array of several to several thousand fine micro-bumps formed on the backside 217 of the FPGA die 202. The TDV 214 electrically couples the portion 212 of the conductive interconnect to the contacts 216. The TDV 214 extends from the backside of the FPGA die 202 towards the face side of the FPGA die 202 to couple with the conductive interconnect. The width of the TDV 214 depends on the thickness of the semiconductor substrate of the FPGA die 202. For example, for substrates ranging from 10 μm to 100 μm, the width of TDV 214 may range between 2 μm and 15 μm. Fabrication of the TDV 214 is known in the art. (See, for example U.S. Pat. Nos. 6,875,921 "Capacitive Interposer" and 7,233,061 "Interposer for impedance matching", the disclosures of which are hereby incorporated by reference in their entirety for all purposes).

The second IC die 204 is electrically and mechanically coupled to the contacts 216 on the FPGA die by a corresponding array of contacts (not separately shown) on the second IC die. The contacts 216 couple circuitry of the second IC die 204 to the TDV 214. In this manner, circuitry on the second IC die 204 is configured for communication with circuitry on the FPGA die 202. Those skilled in the art will appreciate that the FPGA die 202 may include a plurality of TDVs for coupling electrical signals between circuits on the FPGA die 202 and circuits on the second IC die 204. A PHI tile 150 includes TDVs for providing an interface between FPGA logic and one or more stacked ICs.

Figure 3:
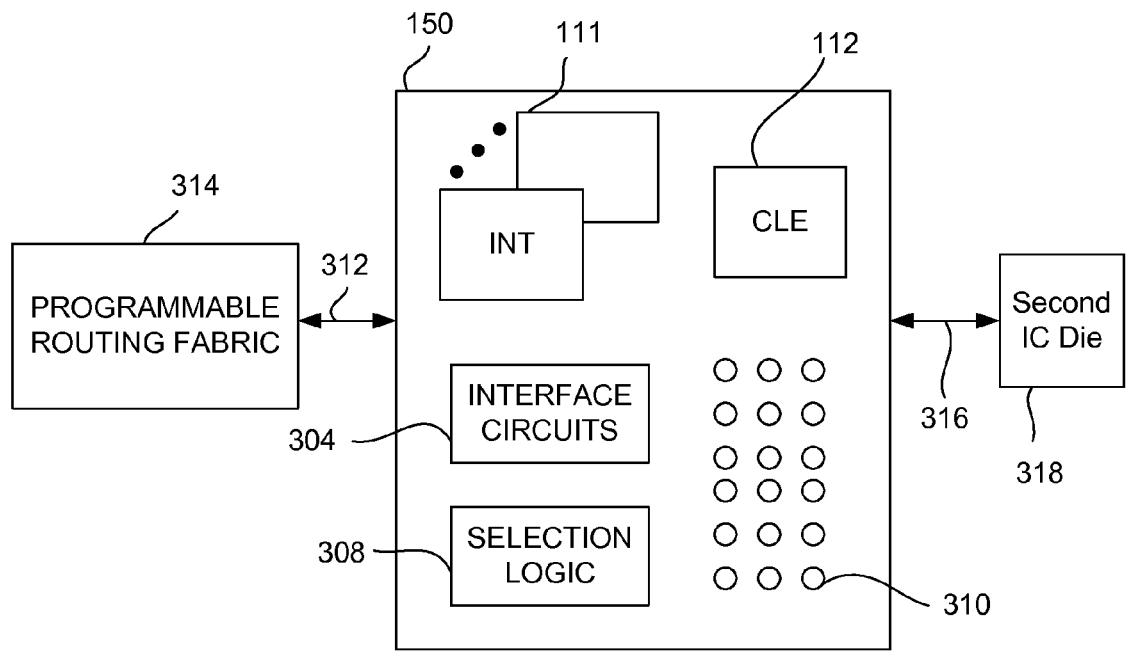
FIG. 3 is a block diagram depicting an exemplary embodiment of an interface tile in accordance with one or more aspects of the invention.

FIG. 3 is a block diagram depicting an exemplary embodiment of a PHI tile 150 in accordance with one or more aspects of the invention. The PHI tile 150 includes one or more programmable interconnect elements 111, a configurable logic element 112, interface circuits 304, selection logic 308, and a plurality of TDVs 310. The PHI tile 300 includes an interface 312 to programmable routing fabric 314 of the FPGA, and an interface 316 with a second IC die 318. The interface 316 includes a plurality of contacts formed on the backside of the FPGA die (e.g., contacts 216 shown in FIG. 2). The contacts of the interface 316 are electrically coupled to conductive interconnect of the second IC die 318 (e.g., interconnect 208 shown in FIG. 2). The interface 312 includes various routing conductor segments that form part of the FPGA routing fabric 314.

Each of the programmable interconnect elements 111 includes programmable multiplexing structures that couple the PHI tile 150 to the routing conductor segments of the interface 312. The configurable logic element 112 includes one or more slices of logic having lookup tables (LUTs), multiplexers, flip-flops, and the like, as described above with respect to the CLBs.

The interface circuits 304 facilitate communication between the FPGA routing fabric 314 and the second IC die 316 through the TDVs 310. The selection logic 308 is configured to selectively change the function of the PHI tile 150 between a programmable logic tile (e.g., a CLB) and an interface tile. For example, the selection logic 308 may be configured such that signals received from the FPGA routing fabric 314 are coupled to the CLE 112, and signals produced by the CLE 112 are coupled to the FPGA routing fabric 314. In other words, the selection logic 308 causes the PHI tile 150 to operate similar to a CLB tile (e.g., CLB 102). Alternatively, the selection logic 308 may be configured such that signals received from the FPGA routing fabric 314 are coupled to the second IC die 318 through the interface circuits 304 and the TDVs 310, and signals produced by the PHI tile 150 are coupled to the FPGA routing fabric 314 through the interface circuits 304 and the TDVs 310. In other words, the selection logic 308 cause the PHI tile 150 to operate as an interface tile between the FPGA routing fabric 314 and the second IC die 318. The function of the PHI tile 150 as implemented by the selection logic 308 may be controlled by the configuration memory cells of the FPGA (not shown) or by a control signal either external to or internal to the PHI tile 150.

In some embodiments, the interface circuits 304 provide voltage level translation. In some cases, the PHI tile 150 and the FPGA may operate using a different supply voltage than the second IC die 318. The voltage of signals originating from the FPGA routing fabric 314 and destined for the second IC die 318 is translated to the voltage required by the second IC die 318. Likewise, the voltage of signals originating from the second IC die 318 and destined for the FPGA routing fabric 314 is translated to the voltage required by the FPGA. In some embodiments, the interface circuits 304 also provide for registering of signals coupled from the FPGA routing fabric 314 to the second IC die 318, and signals coupled from the second IC die 318 to the FPGA routing fabric 314.

The TDVs 310 are electrically coupled to contacts on the backside of the FPGA die (e.g., contacts 216 in FIG. 2). The TDVs 310 are further electrically coupled to integrated circuitry forming the logic of the PHI tile 150 through the conductive interconnect of the FPGA die. As described above, the TDVs 310 enable communication of signals between the PHI tile 150 and the second IC die 318.

Figure 4:
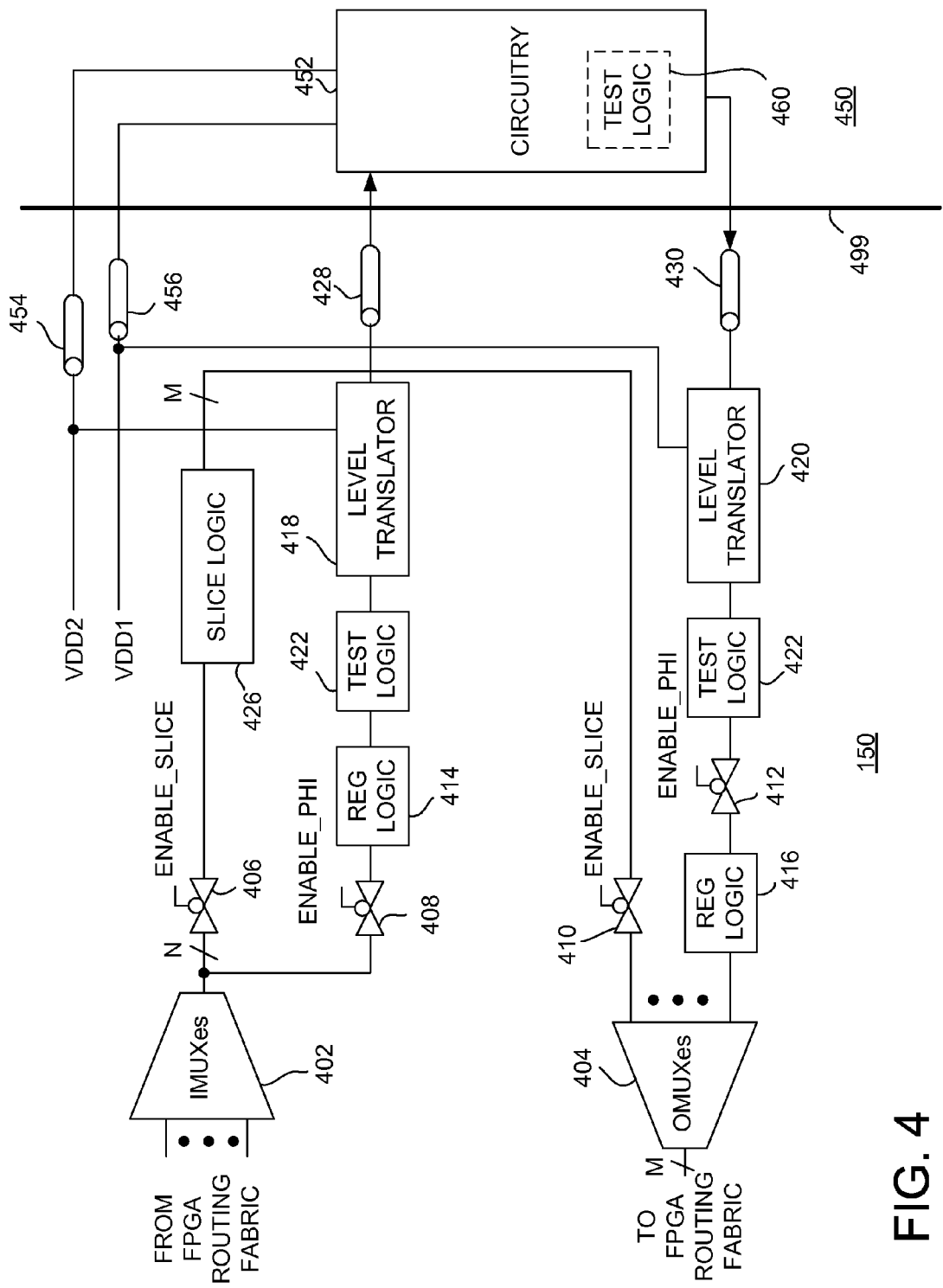
FIG. 4 is a block diagram depicting a more detailed exemplary embodiment of an interface tile in accordance with one or more aspects of the invention.

FIG. 4 is a block diagram depicting a more detailed exemplary embodiment of a PHI tile 150 in accordance with one or more aspects of the invention. In the present embodiment, the PHI tile 150 includes input multiplexing logic (IMUXes 402), output multiplexing logic (OMUXes 404), three-state buffers 406, 408, 410, and 412, register logic 414 and 416, level-translation circuits 418 and 420, test circuitry 422, slice logic 426, and TDVs 428 and 430. With respect to FIG. 3, the three-state buffers 406 through 412 comprise the selection logic 308. The register logic 414, level-translation circuit 418, and test circuitry 422 comprise a first interface circuit. The register logic 416, level-translation circuit 420, and test circuitry 422 comprise a second interface circuit. The IMUXes 402 and OMUXes 404 comprise the programmable interconnect elements. The slice logic 426 comprises the configurable logic element.

Inputs of the IMUXes 402 are coupled to the FPGA routing fabric. An output of the IMUXes 402 is coupled to inputs of the three-state buffers 406 and 408, respectively. The output of the IMUXes 402 illustratively includes N terminals, where N is an integer greater than zero (i.e., the IMUXes 402 include N multiplexers). The IMUXes 402 are configured to couple selected routing conductors of the FPGA routing fabric to the three-state buffers 406 and 408.

An output of the three-state buffer 406 is coupled to an input of the slice logic 426. The slice logic 426 includes a plurality of slices. Each of the slices includes various logic elements, including LUTs, flip-flops, combinatorial logic, and the like. An output of the three-state buffer 408 is coupled to an input of the register logic 414. The register logic 414 includes a plurality of registers (e.g., flip-flops). For example, the register logic 414 may include N flip-flops, one for each terminal of the output of the IMUXes 402.

A control input of the three-state buffer 406 is configured to receive an enable_slice signal. A control input of the three-state buffer 408 is configured to receive an enable_PHI signal. The enable_slice and enable_PHI signals may be generated externally to the PHI tile 150 or may be set by configuration memory cells. If the enable_slice signal is active, the outputs of the IMUXes 402 are coupled to the slice logic 426. If the enable_slice signal is inactive, the three-state buffer 406 provides a high-impedance output for the slice logic 426. Likewise, if the enable_PHI signal is active, the outputs of the IMUXes 402 are coupled to the register logic 414. If the enable_PHI signal is inactive, the three-state buffer 408 provides a high-impedance output for the register logic 414. In this manner, the enable_slice and enable_PHI signals control whether the IMUXes 402 drive the slice logic 426 and/or the register logic 414. In one embodiment, the three-state buffers 406 and 408 are configured such that the IMUXes 402 drive either the slice logic 426 or the register logic 414.

An output of the slice logic 426 is coupled to an input of the three-state buffer 410. The output of the slice logic 426 is illustratively shown as having M terminals, where M is an integer greater than zero. An output of the three-state buffer 410 is coupled to inputs of the OMUXes 404. The OMUXes 404 include M multiplexers. An output of the three-state buffer 412 is coupled to an input of the register logic 416. An output of the register logic 416 is coupled to the inputs of the OMUXes 404. The register logic 416 includes a plurality of registers (e.g., flip-flops). For example, the register logic 416 may include M flip-flops. A control input of the three-state buffer 410 is configured to receive the enable_slice signal. A control input of the three-state buffer 412 is configured to receive the enable_PHI signal. The three-state buffers 410 and 412 operate in a manner similar to the three-state buffers 406 and 408. An output of the OMUXes 404 is coupled to the FPGA routing fabric.

Using the three-state buffers 406-412, the PHI tile 150 may function as a CLB or as an interface tile for interfacing the second IC die 450. The three-state buffers 406 and 410 may be active, causing input signals to pass from the IMUXes 402 through the slice logic 426, and output signals to pass from the slice logic 426 to the OMUXes 404. Alternatively, the three-state buffers 408 and 412 may be active, causing input signals to pass from the IMUXes 402 through the register logic 414, level-translation circuit 418, test circuitry 422, and TDVs 428 to the circuitry 452 on the second IC die 450, and output signals to pass through the TDVs 430, test circuitry 422, level-translation circuit 420, and register logic 416 to the OMUXes 404. In some embodiments, slice logic 426 is omitted. In some embodiments, 3-state buffers 406 and 408 are omitted and inputs are presented to both slice logic 426 and register logic 414. In some embodiments, 3-state buffers 410 and 412 are omitted and OMUXes 404 select the proper output of the slice.

An output of the register logic 414 is coupled to an input of the level-translation circuit 418 through the test circuitry 422. An output of the level translation circuit 418 is coupled to the TDVs 428. The TDVs 428 are electrically coupled circuitry 452 in a second IC die 450. The second IC die 450 is electrically and mechanically coupled to the backside of the die of the FPGA having the PHI tile 150. The circuitry 452 is illustratively configured to receive a pair of voltage supplies, denoted as VDD1 and VDD2. The voltage supplies VDD1 and VDD2 are provided to the second IC die 450 through TDVs 454 and 456, respectively. The TDVs 454 and 456 may be part of the PHI tile 150 or may be located externally to the PHI tile 150. The TDVs 454 and 456 receive the supply voltages VDD1 and VDD2 from external I/O pads of the FPGA or from voltage regulation logic on the FPGA (not shown). A line 499 demarcates the boundary between the FPGA and the second IC die.

Another input of the level-translation circuit 418 is configured to receive the supply voltage VDD2. Assume the FPGA (and hence the PHI tile 150) operates using the voltage supply VDD1, and the circuitry 452 of the second IC die 450 operates using the voltage supply VDD2. The level-translation circuit 418 is configured to translate the voltage of signals received from the register logic 414 from VDD1 to VDD2. This allows the signals provided by the register logic 414 to properly drive the circuitry 452.

In the present example, the TDVs 428 include N TDVs for providing N signals to the circuitry 452 in the second IC die 450. The TDVs 430 include M TDVs for receiving M signals from the circuitry 452 in the second IC die 450. The TDVs 430 are electrically and mechanically coupled to the backside of the die of the FPGA having the PHI tile 150. An input of the level-translation circuit 420 is electrically coupled to the TDVs 430. An output of the level translation circuit 420 is coupled to an input of the three-state buffer 412 through the test logic 422.

Another input of the level-translation circuit 420 is configured to receive the supply voltage VDD1. The level-translation circuit 420 is configured to translate the voltage of signals received from the circuitry 452 in the second IC die 450 from VDD2 to VDD1. This allows the signals provided by the second IC die 450 to properly drive circuitry in the FPGA that uses the VDD1 supply voltage.

Figure 5:
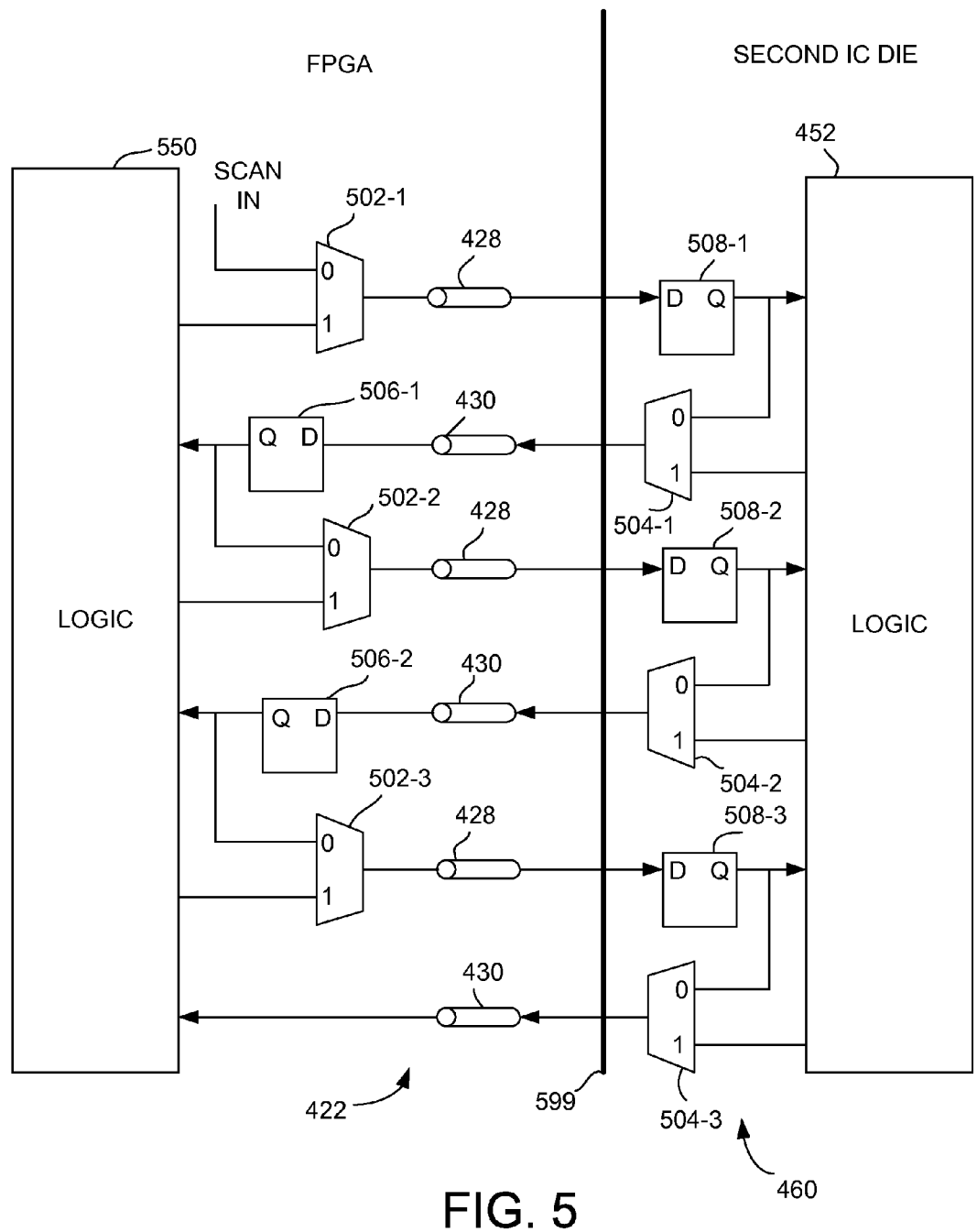
FIG. 5 is a block diagram depicting an exemplary embodiment of test circuitry in an interface tile in accordance with one or more aspects of the invention.

In one embodiment, the test circuitry 422 cooperates with test circuitry 460 on the second IC die 450 to provide a scan chain. Alternatively, the test circuitry 422 may include all circuits for providing the scan chain. Notably, FIG. 5 is a block diagram depicting an exemplary embodiment of the test circuitry 422 in accordance with one or more aspects of the invention. A line 599 demarcates the boundary between the FPGA and the second IC die. In the present example, logic 550 in the FPGA is coupled to the circuitry 452 of the second IC die 450 through the PHI tile 150. Elements of the PHI tile 150 other than the test circuitry 422 have been omitted for clarity.

The test circuitry 422 includes a plurality of multiplexers 502 and a plurality of flip-flops 506. Multiplexers 502-1 through 502-3, and flip-flops 506-1 and 506-2, are shown by example. The test circuitry 460 on the second IC die 450 also includes a plurality of multiplexers 504 and a plurality of flip-flops 508. Multiplexers 504-1 through 504-3, and flip-flops 508-1 through 508-3, are shown by example. One input of each of the multiplexers 502 is configured to receive one of the signals provided by the logic 550 (i.e., one of the N signals provided as input by the PHI tile 150). These inputs are selected if the multiplexers 502 receive a logic '1' control signal. An output of each of the multiplexers 502 is electrically coupled to one of the TDVs 428. In addition, an input of each of the flip-flops 508 (designated as "D") is electrically coupled to one of the TDVs 428. An output of each of the flip-flops 508 (designated as "Q") is coupled to the circuitry 452. The output of each of the flip-flops 508 is also coupled to another input of one of the multiplexers 504. These inputs are selected if the multiplexers 504 receive a logic '0' control signal.

Likewise, one input of each of the multiplexers 504 is configured to receive a signal produced by the circuitry 452 on the second IC die 450. These inputs are selected if the multiplexers 504 receive a logic '1' control signal. An output of each of the multiplexers 504 is electrically coupled to one of the TDVs 430. In addition, an input of each of the flip-flops 506 is electrically coupled to one of the TDVs 430. Outputs of the flip-flops 506 are coupled to the logic 550. The output of each of the flip-flops 506 is also coupled to another input of one of the multiplexers 502. These inputs are selected if the multiplexers 502 receive a logic '0' control signal.

In normal mode, the multiplexers 502 are controlled to pass signals from the logic 550 to the circuitry 452 on the second IC die 450 through the TDVs 428. Likewise, the multiplexers 504 are controlled to pass the signals from the circuitry 452 to the logic 550 through the TDVs 430. In normal mode, the multiplexers 502 and 504 are driven by a logic '1' control signal. During the normal mode, the flip-flops 508 capture output state of the logic 550 and the flip-flops 506 capture output state of the circuitry 452.

In a test mode, the multiplexers 502 and 504 are driven by a logic '0' control signal. The multiplexers 502 are controlled to pass signals from the flip-flops 506, with the exception of the multiplexer 502-1, which selects a scan-in input. The scan-in input may provide a logic '0' or logic '1' input, or may receive input from test logic of another PHI tile in the FPGA. The multiplexers 504 are controlled to pass signals provided by the flip-flops 508. In this manner, the flip-flops 506 and 508 form a serial chain of flip-flops through which data may be shifted. The shifted out data is received by the logic 550 as a serial stream of bits. Thus, the state of the data input to the second IC die 450 and the data output by the second IC die 450 can be captured by the test circuitry 422 and 460.

In another embodiment, the multiplexers 504 and/or the flip-flops 508 are part of the test logic 422. In essence, all or a portion of the test logic 460 may be moved across the boundary 599. This reduces or eliminates special test logic in the second IC die 450. Additional details regarding stacked FPGAs are found in commonly owned U.S. Pat. No. 7,518,398, entitled INTEGRATED CIRCUIT WITH THROUGH-DIE VIA INTERFACE FOR DIE STACKING, issued Apr. 14, 2009, previously incorporated by reference in its entirety for all purposes.

The programmable logic and interconnect of FPGA 100 must be configured to perform a specific function. The configuration logic of FPGA typically includes a configuration controller that receives data from pins on the FPGA typically connected to an external non-volatile storage device, a frame data register (FDR) to temporarily hold one frame of data after that data is read from the pins in preparation for writing to the configuration memory of the FPGA and a frame address register (FAR) indicating where to store data in the frame data register. Typically, the FPGA configuration logic reads data from pins, storing data in the FDR, updates the frame address register and writes to configuration memory cells. This process is repeated until all configuration data is written to configuration memory cells. When an FPGA is stacked with a second IC die, the second IC die may require configuration as well. In this case, the configuration controller may write some configuration data to the second IC die. Alternatively, the second IC die may store configuration data for the FPGA. In this case the configuration controller may read configuration data from the second IC die and write it to the FPGA configuration memory.

Figure 6:
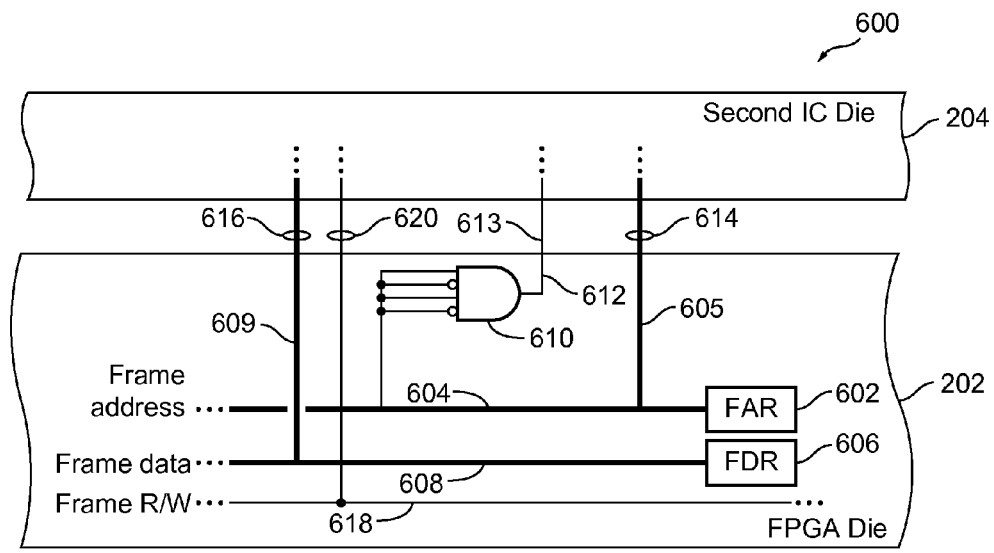
FIG. 6 is a diagram of a stacked IC illustrating a configuration interface according to an embodiment.

FIG. 6 is a diagram of a semiconductor device 600 illustrating a configuration interface between two die according to an embodiment of the present invention. A second IC die 204 is stacked on an FPGA die 202, as described above in reference to FIG. 2. The FPGA die 202 has a frame address register ("FAR") 602 that loads frame addresses to a frame address bus 604 and a frame data register ("FDR") 606 that loads frame data to a frame data bus 608. Low order bits of the frame address carried on the frame address bus 604 are provided directly to the second IC die 204 on an inter-chip frame address bus 605 for frame addressing inside the second IC die, while high order bits of the frame address are provided to a decoder 610 that generates a configuration data enable signal 612 that is coupled from the FPGA die to the second IC die through a contact 613. Decoder 610 matches bit pattern '0101', but this is for illustration only. Any suitable bit pattern can be matched by decoder 610. Further, decoder 610 may be programmable by the FPGA configuration. In an embodiment with multiple second IC die, multiple decoders may decode a different bit pattern of the high-order bits for each second IC die. High-order bits of the frame address register typically indicate a type of logic resource to program on the FPGA. For example, they may indicate CLB frames, I/O frames, BRAM frames or PHI frames. High-order bits are typically few in number. In FIG. 5, four high-order bits are shown, but other numbers of bits are accommodated in other embodiments. Alternatively, both the high order and low order frame address bits are connected directly to the second IC die 204. The configuration data enable signal 612 is provided to the second IC die 204 so that the second IC die can capture its configuration data.

The inter-chip frame address bus 605 includes a first plurality of contacts 614 of an inter-chip contact array (see, e.g., FIG. 2, ref. num. 216) connecting a first plurality of contacts formed on the FPGA die to a corresponding first plurality of contacts formed on the second IC die. In a particular embodiment, the first plurality of connections are solder joints formed from microbumps on one or both of the IC dice. In a particular embodiment, the number of contacts in the first plurality of contacts is equal to or greater than the bit width of the frame address(es) provided to the second IC die 204. Frame data is provided on the frame data bus 608, which is connected to the second IC die 204 with an inter-chip frame data bus 609 that includes a second plurality of contacts of the inter-chip contact array connecting a second plurality of contacts formed on the FPGA die to a corresponding second plurality of contacts formed on the second IC die. In a particular embodiment, the first plurality of connections are solder joints formed from microbumps on one or both of the IC dice. In a particular embodiment, the number of contacts in the second plurality of contacts is equal to or greater than the frame data width. A frame read/write ("R/W") signal 618 is provided to or generated in the FPGA die 202 and connected to the second IC die 204 through a contact 620.

When a frame is written into the FPGA die 202, the FPGA processes the frame to read the frame header and determine whether the frame data belongs to the FPGA die 202 or to the second IC die 204. For example, the FPGA reads the frame header and compares it against frame addresses stored in a look-up table of the FPGA, thus, the FPGA controls where the frame addresses of the second IC die 204 reside in its order space. The FPGA die 202 routes the frame data to the appropriate frame address.

In a particular embodiment, when the FPGA reads a frame with a frame address indicating the frame is for the second IC die, the data is held in the FDR 606 of the FPGA. The destination address for the frame is set in the FAR 602 and then executes a WRITE operation (i.e., asserts 'write' on frame R/W 618 passed to second IC die through contact 620 and may assert stacked die enable 613). This allows using standard FPGA configuration techniques to be used to configure the semiconductor device die 600.

In another embodiment, the FPGA may accept configuration data from the second IC die. This may occur if the second IC die is a non-volatile memory or if the second IC die is a communication interface. In this embodiment, the FPGA initiates a read operation from the second IC die by setting an address on address signals 614 and asserting read on signal 620 and second IC die enable 613. The second IC die may then put its stored configuration data on data lines 616. In one embodiment, the FPGA stores the frame data in the FDR, sets the FAR to the FPGA's frame data and writes data into the FGPAs configuration memory. In another embodiment, the FPGA simultaneously drives a corresponding frame address for the FPGA using the FAR and the frame data is stored directly to the FPGA configuration memory. This allows frames to be written to or read from the second IC die at essentially the same speed as if the frames were written to the FPGA or if the frames were read from an external FPGA configuration file.

Figure 7A:
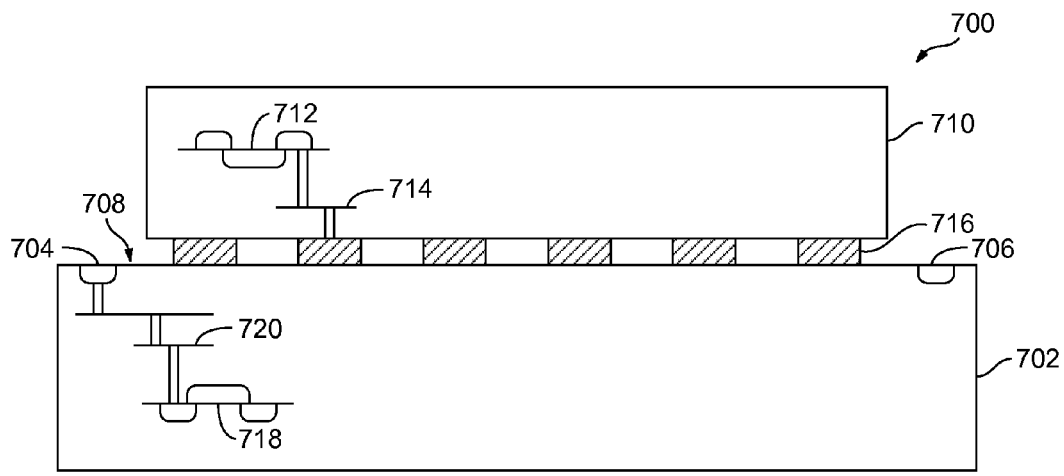
FIG. 7A is a cross-sectional view showing an exemplary embodiment of a semiconductor device in accordance with one or more aspects of the invention.

FIG. 7A is a cross-sectional view showing an exemplary embodiment of a semiconductor device 700 in accordance with one or more aspects of the invention. The semiconductor device 700 includes an FPGA die 702 and a second IC die 710. The semiconductor device including the FPGA die 702 and the second IC die 710 is configured according to an embodiment. The second IC die 710 may comprise any type of digital, analog, or mixed-signal IC. The second IC die 710 is vertically stacked with the FPGA die 702. The face side of the second IC die 710 is mounted to the faceside 708 of the FPGA die 702.

In particular, the second IC die 710 includes circuitry formed on a semiconductor substrate. A portion of the circuitry is symbolically shown by a transistor 712. The second IC die 710 also includes a conductive interconnect formed over the circuitry. A portion 714 of the conductive interconnect is symbolically shown by signal vias coupled to a metal layer.

The FPGA die 702 includes circuitry formed in a semiconductor substrate, symbolically represented by a transistor 718, and conductive interconnects formed over the circuitry, typically in a number of interconnected patterned metal layers, symbolically represented by signal vias coupled to a metal layer 720. The FPGA die 702 is an FPGA intended for a wire bonding application. That is, bond wires (not shown) are attached to wire bonding pads 704, 706 on the top side 708 of the FPGA die 702. The bond wires connect the wire bonding pads 704, 706 to bonding areas (not shown) on a carrier, package base (not shown), printed wiring substrate, or other substrate, as is well known in the art of ICs.

The FPGA die 702 also includes an array of contacts 716, which in a particular embodiment are an array of several to several thousand fine micro-bumps formed on the topside 708 of the FPGA die 702. The second IC die 710 is electrically and mechanically coupled to the contacts 716. The contacts 716 couple circuitry of the second IC die 710 to the FPGA die 702. In this manner, circuitry on the second IC die 710 is configured for communication with circuitry on the FPGA die 702 through the contacts 716 that allow accessing resources on the second IC die 710 as though they were physically in the FPGA die, which in a particular embodiment means that the second IC die is accessed without going through an I/O block of the FPGA die. In a particular embodiment, a PHI tile (not shown) in the FPGA die 702 provides an interface between FPGA logic and one or more stacked ICs.

Figure 7B:
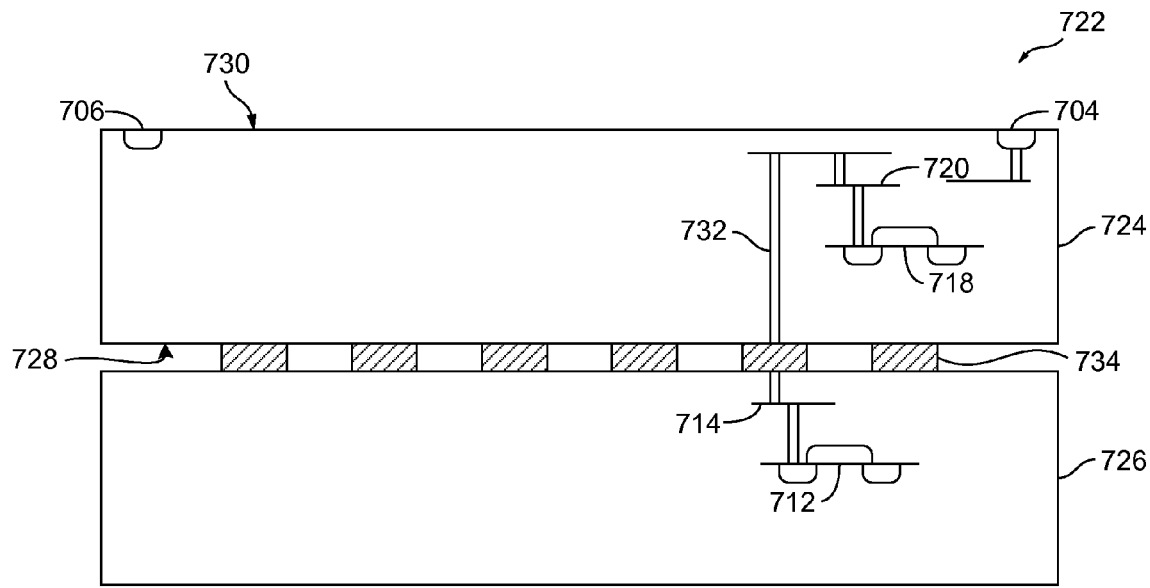
FIG. 7B is a cross-sectional view showing another embodiment of a semiconductor device in accordance with one or more aspects of the invention.

FIG. 7B is a cross-sectional view showing another embodiment of a semiconductor device 722 in accordance with one or more aspects of the invention. The semiconductor device 700 includes an FPGA die 724 and a second IC die 726. The second IC die 726 may comprise any type of digital, analog, or mixed-signal IC. The second IC die 726 is vertically stacked with the FPGA die 724. The face side of the second IC die 726 is mounted to the backside 728 of the FPGA die 724.

The second IC die 726 includes circuitry formed on a semiconductor substrate. A portion of the circuitry is symbolically shown by a transistor 712. The second IC die 726 also includes a conductive interconnect formed over the circuitry. A portion 714 of the conductive interconnect is symbolically shown by signal vias coupled to a metal layer.

The FPGA die 724 includes circuitry formed in a semiconductor substrate, symbolically represented by a transistor 718, and conductive interconnects formed over the circuitry, typically in a number of interconnected patterned metal layers, symbolically represented by signal vias coupled to a metal layer 720. The FPGA die 724 is an FPGA intended for a wire bonding application. That is, bond wires (not shown) are attached to wire bonding pads 704, 706 on the top side 730 of the FPGA die 724. The bond wires connect the wire bonding pads 704, 706 to bonding areas (not shown) on a carrier, package base (not shown), printed wiring substrate, or other substrate, as is well known in the art of ICs.

The FPGA die 724 also includes a through-die via (TDV) 732 and an array of contacts 734, which in a particular embodiment are an array of several to several thousand fine micro-bumps formed on the backside 728 of the FPGA die 724. The TDV 732 electrically couples the portion 720 of the conductive interconnect to the contacts 734. The TDV 732 extends from the backside 728 of the FPGA die 724 towards the face side 730 of the FPGA die 724 to couple with the conductive interconnect. The width of the TDV 732 depends on the thickness of the semiconductor substrate of the FPGA die 724. For example, for substrates ranging from 10 µm to 100 µm, the width of TDV 732 may range between 2 µm and 15 µm.

The contacts 734 couple circuitry of the second IC die 726 to the FPGA die 724. In this manner, circuitry on the second IC die 726 is configured for communication with circuitry on the FPGA die 724 through the contacts 734 that allow accessing resources on the second IC die 726 as though they were physically in the FPGA die, which in a particular embodiment means that the second IC die is accessed without going through an I/O block of the FPGA top die. In a particular embodiment, a PHI tile (not shown) in the FPGA die 724 provides an interface between FPGA logic and one or more stacked IC dies.

Figure 8B:
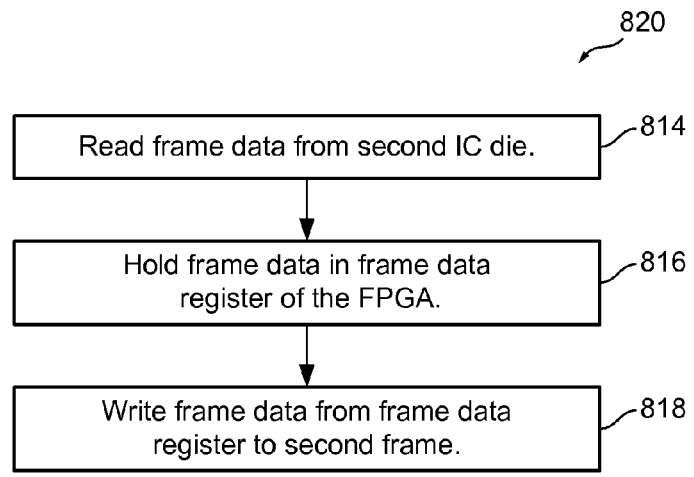
FIG. 8B is a flow chart of a method of reading data from a second IC die stacked on an FPGA die according to another embodiment of the invention.
Figure 8A:
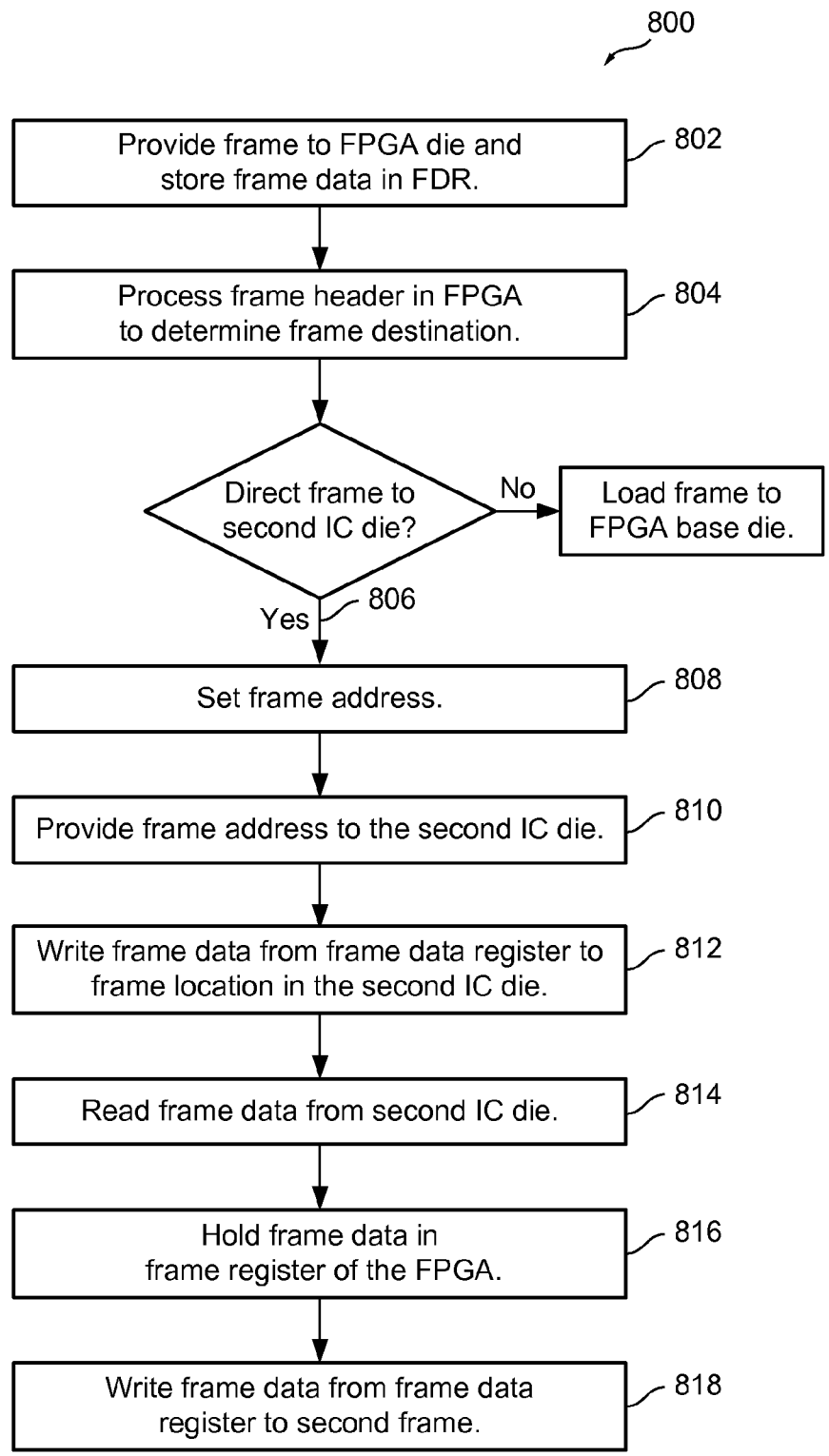
FIG. 8A is a flow chart of a method of configuring a stacked IC according to an embodiment.

FIG. 8A is a flow chart of a method of configuring a stacked IC 800 according to an embodiment. The stacked IC has an FPGA die and a second IC die stacked on the FPGA die. A frame is provided to the FPGA die (step 802) and the FPGA die processes a frame header of the frame to determine whether frame data of the frame is directed to a frame address in the FPGA die or to a frame address in the second IC die (step 804). If the frame is directed to a frame address in the second IC die (branch 806), the FPGA die sets the frame address (step 808) and at least low order bits of the frame address is provided to the second IC die through an inter-chip frame address bus (step 810). In a particular embodiment, low order bits of the frame address are passed directly from the FPGA die to the second IC die and high order bits of the frame address are used in the FPGA die to produce a configuration data enable signal. Alternatively, both high order and low order bits are passed to the second IC die.

Frame data is written from a frame data register of the FPGA to the second IC die through an inter-chip frame data bus (step 812). In a particular embodiment, the inter-chip frame data bus has a bus width equal to or greater than the frame data width. In a more particular embodiment, the inter-chip frame data bus includes at least 1312 micro-bump contacts of the FPGA die.

In a further embodiment, the FPGA die reads a frame from the second IC die (step 814) and holds the frame data from the second IC die in a frame data register of the FPGA die (step 816), and then writes the frame data from the frame data register to a second frame (step 818). In a particular embodiment, the frame data is read from the second IC die using a DMA technique. In one embodiment, the second frame is located in the FPGA die. In a further embodiment, the frame data is used to configure the FPGA die. In an alternative embodiment, the second frame is located in the second IC die.

FIG. 8B is a flow chart of a method 820 of reading data from a second IC die stacked on an FPGA die according to another embodiment of the invention. The FPGA die reads a frame from the second IC die (step 814) and holds the frame data from the second IC die in a frame data register of the FPGA die (step 816), and then writes the frame data from the frame data register to a second frame (step 818). In a particular embodiment, the frame data is read from the second IC die using a DMA technique. In one embodiment, the second frame is located in the FPGA die. In a further embodiment, the frame data is used to configure the FPGA die. In an alternative embodiment, the second frame is located in the second IC die.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of configuring a stacked integrated circuit ("IC") comprising:
   providing a frame having configuration frame data and a configuration frame address in a frame header to a first integrated circuit die of the stacked IC, wherein the first integrated circuit die includes configurable logic;
   storing the configuration frame data in a frame data register of the first integrated circuit die;
   processing the frame header to determine whether a frame destination is for configurable logic in the first integrated circuit die or is in a second integrated circuit die that is stacked on the first integrated circuit die and electrically coupled to the first integrated circuit die through an array of inter-chip contacts;
   in response to determining that the frame destination is in the second integrated circuit die, providing the configuration frame address to the second integrated circuit die through an inter-chip frame address bus including a first plurality of the array of inter-chip contacts; and
   writing the configuration frame data from the frame data register of the first integrated circuit die to the frame destination through an inter-chip frame data bus including a second plurality of the array of inter-chip contacts.

2. The method of claim 1, further comprising:
   reading the configuration frame data from the second integrated circuit die to the first integrated circuit die;
   holding the configuration frame data in the frame data register of the first integrated circuit die; and then
   writing the configuration frame data to a second frame destination.

3. The method of claim 2, wherein the second frame destination is in the first integrated circuit die.

4. The method of claim 2, wherein the configuration frame data from the second integrated circuit configures the configurable logic of the first integrated circuit die.

5. The method of claim 2, wherein the reading the configuration frame data from the second integrated circuit die to the first integrated circuit die includes direct memory access.

6. The method of claim 2, wherein the second frame destination is in the second integrated circuit die.

7. The method of claim 1, wherein the configuration frame data configures the second integrated circuit die.

8. The method of claim 1, wherein the first integrated circuit die comprises a programmable integrated circuit die.

9. The method of claim 8, wherein the programmable integrated circuit die comprises a Field Programmable Gate Array die.

10. The method of claim 1, wherein the second integrated circuit die comprises at least one of a non-volatile memory or a communication interface.

11. A method of reading data by a first integrated circuit die, the method comprising:

reading configuration frame data from a second integrated circuit die to the first integrated circuit die through an array of inter-chip contacts, wherein the second integrated circuit die is stacked on and connected to the first integrated circuit die by the array of inter-chip contacts, and the first integrated circuit die and the second integrated circuit die include configurable logic;

holding the configuration frame data in a frame data register of the first integrated circuit die; and writing the configuration frame data to a frame destination that configures the configurable logic of the first integrated circuit die or the second integrated circuit die.

12. The method of claim 11, wherein the reading the configuration frame data from the second integrated circuit die to the first integrated circuit die includes direct memory access.

13. The method of claim 11, wherein the first integrated circuit die comprises a programmable integrated circuit die.

14. The method of claim 13, wherein the programmable integrated circuit die comprises a Field Programmable Gate Array die.

15. The method of claim 11, wherein the second integrated circuit die comprises at least one of a non-volatile memory or a communication interface.

* * * * *